United States Patent
Broeke et al.

(10) Patent No.: US 7,211,815 B2
(45) Date of Patent: May 1, 2007

(54) METHOD OF ACHIEVING CD LINEARITY CONTROL FOR FULL-CHIP CPL MANUFACTURING

(75) Inventors: Doug Van Den Broeke, Sunnyvale, CA (US); Chungwei Hsu, Taipei (TW); Jang Fung Chen, Cupertino, CA (US)

(73) Assignee: ASML Masktools B.V., Veldhoven (NL)

( * ) Notice: Subject to any disclaimer, the term of this patent is extended or adjusted under 35 U.S.C. 154(b) by 180 days.

(21) Appl. No.: 10/659,715

(22) Filed: Sep. 11, 2003

(65) Prior Publication Data

US 2004/0115539 A1 Jun. 17, 2004

Related U.S. Application Data

(60) Provisional application No. 60/409,599, filed on Sep. 11, 2002.

(51) Int. Cl.
*G01N 21/86* (2006.01)
*G06F 17/50* (2006.01)

(52) U.S. Cl. ............................. 250/548; 716/21; 430/5
(58) Field of Classification Search ................ 250/548; 716/21; 430/5; 382/144, 145
See application file for complete search history.

(56) References Cited

U.S. PATENT DOCUMENTS

| | | | |
|---|---|---|---|
| 5,184,021 A | 2/1993 | Smith | |
| 5,302,477 A | 4/1994 | Dao et al. | |
| 5,348,826 A | 9/1994 | Dao et al. | |
| 5,354,632 A | 10/1994 | Dao et al. | |
| 5,384,219 A | 1/1995 | Dao et al. | |
| 5,424,154 A | 6/1995 | Borodovsky | |
| 5,618,643 A | 4/1997 | Dao et al. | |
| 5,633,102 A | 5/1997 | Toh et al. | |
| 5,840,448 A | 11/1998 | Borodovsky et al. | |
| 5,906,901 A | 5/1999 | Tanimoto | |
| 5,935,733 A | 8/1999 | Scott et al. | |
| 6,114,071 A | 9/2000 | Chen et al. | |
| 6,383,697 B1 | 5/2002 | Vladimirsky et al. | |
| 6,383,719 B1 | 5/2002 | Bula et al. | |
| 6,458,495 B1 | 10/2002 | Tsai et al. | |
| 6,482,555 B2 | 11/2002 | Chen et al. | |
| 6,541,167 B2 | 4/2003 | Petersen et al. | |
| 6,562,522 B1 | 5/2003 | Yan | |
| 6,605,481 B1 * | 8/2003 | Wu et al. | 438/14 |
| 6,623,895 B2 | 9/2003 | Chen et al. | |
| 6,641,959 B2 | 11/2003 | Yan | |

(Continued)

OTHER PUBLICATIONS

Watanabe, Hisashi., et al. "Sub-quarter-micron gate pattern fabrication using a transparent phase shifting mask." J. Vac. Sci. Technol. B 9 (6) Nov./Dec. 1991, pp. 3172-3175.

(Continued)

*Primary Examiner*—Thanh X. Luu
(74) *Attorney, Agent, or Firm*—McDermott Will Emery LLP

(57) ABSTRACT

A method of generating masks for printing a pattern including a plurality of features having varying critical dimensions. The method includes the steps of: (1) obtaining data representing the pattern; (2) defining a plurality of distinct zones based on the critical dimensions of the plurality of features; (3) categorizing each of the features into one of the plurality of distinct zones; and (4) modifying the mask pattern for each feature categorized into a predefined distinct zone of the plurality of distinct zones.

21 Claims, 15 Drawing Sheets

U.S. PATENT DOCUMENTS 6,660,649 B2    12/2003  Dao et al.
6,664,009 B2 *  12/2003  Liu ............................. 430/30

OTHER PUBLICATIONS

Watanabe, H., et al. "Transparent Phase Shifting Mask." Electron Devices Meeting, 1990, Technical Digest., International, IEDM 90-821 to 90-824, pp. 33.2.1 to 33.2.4.

Levenson, Marc D., et al. "SCAA mask exposures and Phase Phirst design for 110nm and below." Optical Microlithography XIV, Proceedings of SPIE vol. 4346 (2001), pp. 817-826.

Kenny, K.H. Toh., et al. "Optical Lithography and Chromeless Phase-Shifted Masks." SPIE vol. 1463, Optical/Laser Microlithography IV (1991) pp. 74-86.

Levenson, Marc D., et al "Improving Resolution in Photolithography with a Phase-Shifting Mask." IEEE Transactions on Electron Devices, vol. Ed-29, No. 12, Dec. 1982, pp. 1828-1836.

Erdely, Miklos., et al. "Enhanced Microlithography Using Phase Shifting and Off-axis Illumination." Jpn. J. Appl. Phys. vol. 34, (1995) Pt. 2, No. 12A, pp. 1629-1631.

Matsuso, Takahiro., et al. "Feasibility Study of an Embedded Transparent Phase-Shifting Mask In ArF Lithography." Optical Microlithography XIII, Proceedings of SPIE, vol. 4000 (2000), pp. 443-451.

Hsu, Chungwei., et al. "Patterning 0.1 um device by using hybrid PSM." Optical Microlithography XIV, Proceedings of SPIE, vol. 4346 (2001), pp. 441-451.

\* cited by examiner

FIG. 4a
FIG. 4b
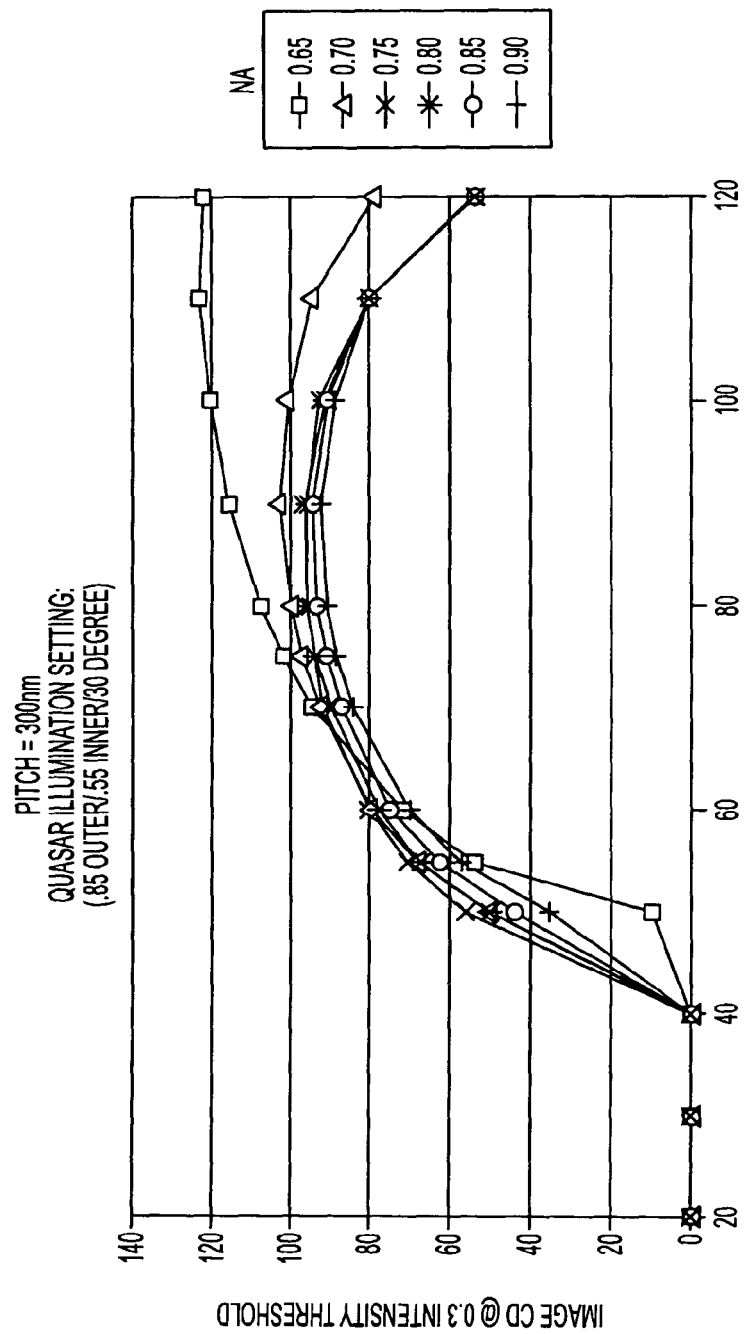
FIG. 4c

METHOD OF ACHIEVING CD LINEARITY CONTROL FOR FULL-CHIP CPL MANUFACTURING

RELATED APPLICATIONS

This application claims priority under 35 U.S.C. § 119 to U.S. Provisional Patent Application Ser. No. 60/409,599 filed on Sep. 11, 2002, the entirety of which is hereby incorporated by reference.

FIELD OF THE INVENTION

The present invention relates generally to the generation of mask patterns for use with chromeless phase lithography (CPL) techniques, and more specifically, for the methods and techniques for controlling and maintaining critical dimension (CD) linearity over a range of CDs to be imaged when utilizing CPL.

BACKGROUND OF THE INVENTION

Lithographic projection apparatus (tools) can be used, for example, in the manufacture of integrated circuits (ICs). In such a case, the mask contains a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic apparatus as here described can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing. Thereafter, the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

The lithographic tool may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic tools are described, for example, in U.S. Pat. No. 5,969,441 and WO 98/40791, incorporated herein by reference.

The photolithography masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way.

Of course, one of the goals in integrated circuit fabrication is to faithfully reproduce the original circuit design on the wafer (via the mask). Another goal is to use as much of the semiconductor wafer real estate as possible. As the size of an integrated circuit is reduced and its density increases, however, the CD (critical dimension) of its corresponding mask pattern approaches the resolution limit of the optical exposure tool. The resolution for an exposure tool is defined as the minimum feature that the exposure tool can repeatedly expose on the wafer. The resolution value of present exposure equipment often constrains the CD for many advanced IC circuit designs.

Furthermore, the constant improvements in microprocessor speed, memory packing density and low power consumption for micro-electronic components are directly related to the ability of lithography techniques to transfer and form patterns onto the various layers of a semiconductor device. The current state of the art requires patterning of CD's well below the available light source wavelengths. For instance the current production wavelength of 248 nm is being pushed towards patterning of CD's smaller than 100 nm. This industry trend will continue and possibly accelerate in the next 5–10 years, as described in the International Technology Roadmap for Semiconductors (ITRS 2000).

One technique, which is currently receiving additional attention from the photolithography community, for further improving the resolution/printing capabilities of photolithography equipment is referred to as chromeless phase lithography "CPL". As is known, when utilizing CPL techniques, the resulting mask pattern typically includes structures (corresponding to features to be printed on the wafer) which do not require the use of chrome (i.e., the features are printed by phase-shift techniques) as well as those that utilize chrome. Such phase shift masks have been disclosed in U.S. Pat. Nos. 6,312,854 and 6,335,130, both of which are herein incorporated by reference.

It is necessary for mask designers to verify that the mask structures utilizing the various techniques all interact in an acceptable manner such that the desired pattern is printed on the wafer. Further, it is highly desirable that as the CDs of the features to be printed vary, the CDs are reproduced accurately. In other words, it is highly desirable that there is "linear" behavior when printing CDs of various widths (i.e., the CD linearity curve should be linear) in order to facilitate the manufacturing process, and minimize the need for multiple illuminations with different settings to obtain acceptable results.

Several solutions are currently known for achieving CD linearity. These solutions include CPL halftoning, and the use of scattering bars for OPC.

Scattering bars (SB) OPC often include changing "local transmission" by placing the SBs near the main feature edges. SBs can modulate the aerial image slope. FIGS. 1–3 illustrate the SB effect for aerial imaging modulation, the SB size effect, and the SB placement effect, using a generic DUV/ArF (193 nm)/4x and NA=0.75, quasar (0.87, 0.57). FIG. 1 illustrates a dose profile depicting the case of no SB, a 50 nm center SB and a 50 nm double SB. FIG. 2 illustrates a plot of CD vs. pitch for a 25 mJ-0.24 threshold chromeless mask (CLM) with chrome scattering bars (Cr SB) at 80 nm separation, for the cases of no SB (dots), a 20 nm SB (circles), a 30 nm SB ("+" signs), a 40 nm SB ("x"s), and a 50 nm SB (boxes). FIG. 2 indicates that a larger SB size causes a high feature CD. For example, in the case of a 20 nm SB, the main feature CD is 95 nm for a pitch of 550 nm (X-axis), and for the case of a 50 nm SB, the main feature CD is 125 nm for a pitch of 550 nm.

FIG. 3 illustrates another plot of CD vs. pitch for a 25 mJ-0.24 threshold CLM with Cr SB at various separations, for the cases of no SB (dots), a 70 nm separation (circles), an 80 nm SB separation ("+" signs), a 90 nm SB separation ("x"s), a 100 nm SB separation (boxes), a 110 nm SB separation (solid boxes), a 120 nm SB separation (triangles), a 130 nm SB separation (circle on white), a 140 nm SB separation (bars), a 150 nm SB separation ("x"s on black), and a 160 nm SB separation (boxes). FIG. 3 depicts the effect of SB placement (SB separation from the main feature edges), and that closer SB placement causes high feature CDs. For example, for a SB at 70 nm, the main feature CD is 110 nm for a pitch of 550 nm (X-axis), and for a SB at 160 nm, the main feature CD is ~77 nm for a pitch of 550 nm.

While such solutions can be utilized in certain situations, in many circumstances, such solutions become exceedingly difficult to implement. For example, in certain mask designs, it can be exceedingly difficult to insert SBs having the desired dimensions in the necessary location.

Accordingly, there exists a need for a method and technique which provides a simple and systematic approach for defining and maintaining "linear" behavior with regard to the printing of CDs, as the CDs of the features contained in the given mask pattern vary.

SUMMARY OF THE INVENTION

In an effort to solve the foregoing needs, it is one object of the present invention to provide a method and technique which provides a simple and systematic approach for defining and maintaining "linear" behavior with regard to the printing of CDs, as the CDs and pitch of the features contained in the given mask pattern vary.

More specifically, in one exemplary embodiment, the present invention relates to a method of generating masks for printing a pattern including a plurality of features having varying critical dimensions. The method includes the steps of: (1) obtaining data representing the pattern; (2) defining a plurality of distinct zones based on the critical dimensions of the plurality of features; (3) categorizing each of the features into one of the plurality of distinct zones; and (4) modifying the mask pattern for each feature categorized into a predefined distinct zone of the plurality of distinct zones.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a) A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from U.S. Pat. No. 5,296,891 and U.S. Pat. No. 5,523,193, which are incorporated herein by reference.

b) A programmable LCD array. An example of such a construction is given in U.S. Pat. No. 5,229,872, which is incorporated herein by reference.

The method of the present invention provides important advantages over the prior art. For example, the present invention provides a simple and systematic approach for defining and maintaining "linear" behavior with regard to the printing of CDs, as the CDs and pitch of the features contained in the given mask pattern vary. Moreover, the present invention a simple method for allowing for the use of the resolution enhancements associated with the CPL technology.

Additional advantages of the present invention will become apparent to those skilled in the art from the following detailed description of exemplary embodiments of the present invention.

The invention itself, together with further objects and advantages, can be better understood by reference to the following detailed description and the accompanying drawings.

BRIEF DESCRIPTION OF THE DRAWINGS

FIGS. 4a–4c illustrate an exemplary aerial image behavior of chromeless phase features (CPL) as the width of the CD of the feature being imaged varies.

DETAILED DESCRIPTION OF THE INVENTION

When analyzing a CD linearity curve of a CPL mask, it is useful to consider the "mask error enhancement factor" (MEEF). In accordance with the present invention, the CD linearity curve for a chromeless phase shift mask, such as a CPL mask, can be divided into essentially three regions: a $1^{st}$ imaging region that has positive MEEF; a $2^{nd}$ imaging region that has near zero MEEF; and a $3^{rd}$ imaging region that has negative MEEF. It is widely accepted that in the case of near zero and negative MEEF it is essentially impossible to achieve CD linearity.

FIGS. 4a–4c illustrates the aerial image behavior of a typical CPL mask feature as a plot of image CD at a 0.3 intensity threshold vs. feature width. As illustrated in FIG. 4a, the feature 10 being imaged has a width (i.e., CD) that is defined by the adjacent two phase edges 12 and 14, which are formed, for example, on a quartz mask substrate 16 as shown in FIG. 4b. The pitch of the features utilized in the example of FIG. 4a is 300 nm. Further, in the exemplary illustration, the quasar illumination setting is 0.85 outer/0.55 inner/30 degree.

Figure 1:
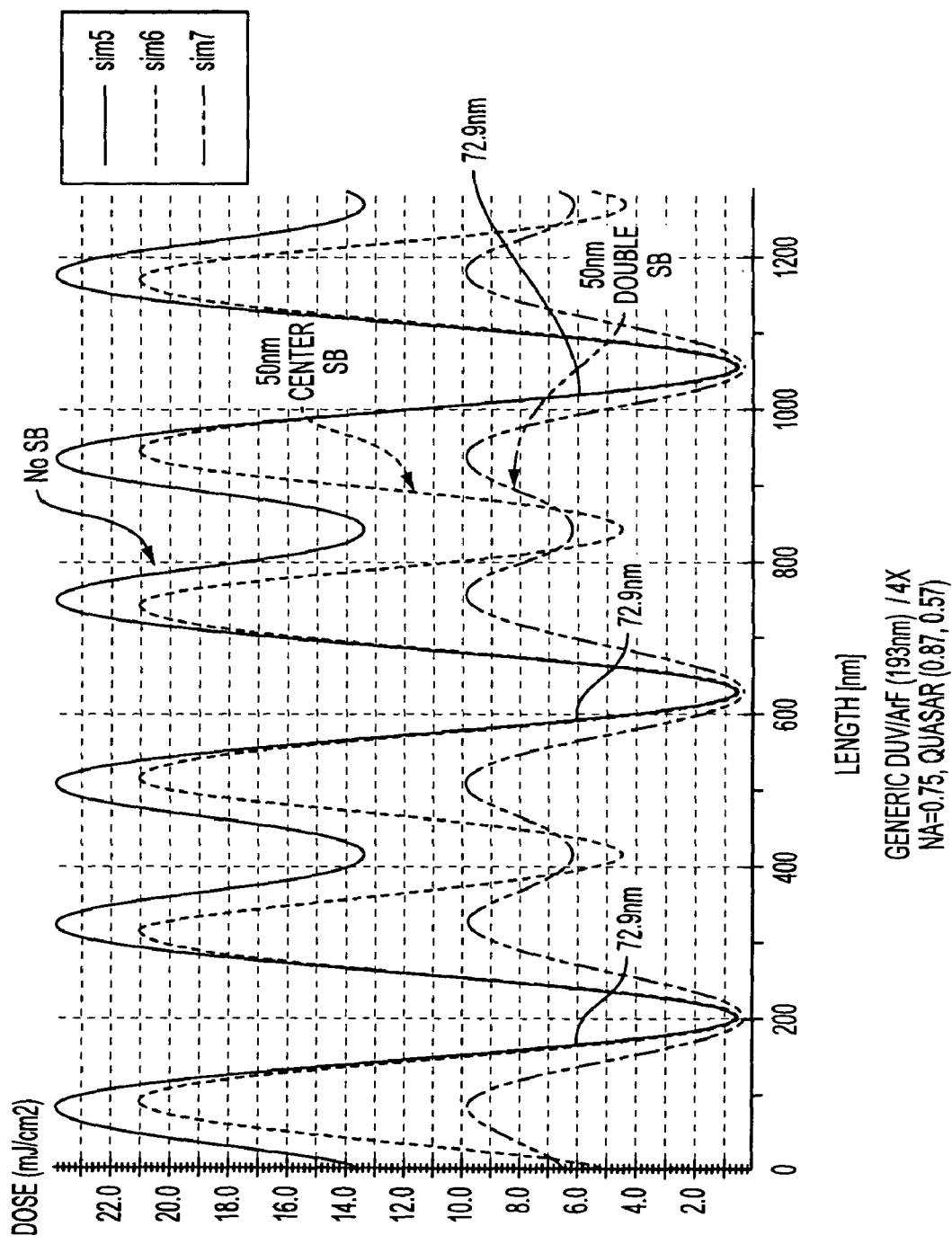
FIGS. 1–3 are exemplary plots illustrating the effects of scattering bars for a convention mask.
Figure 2:
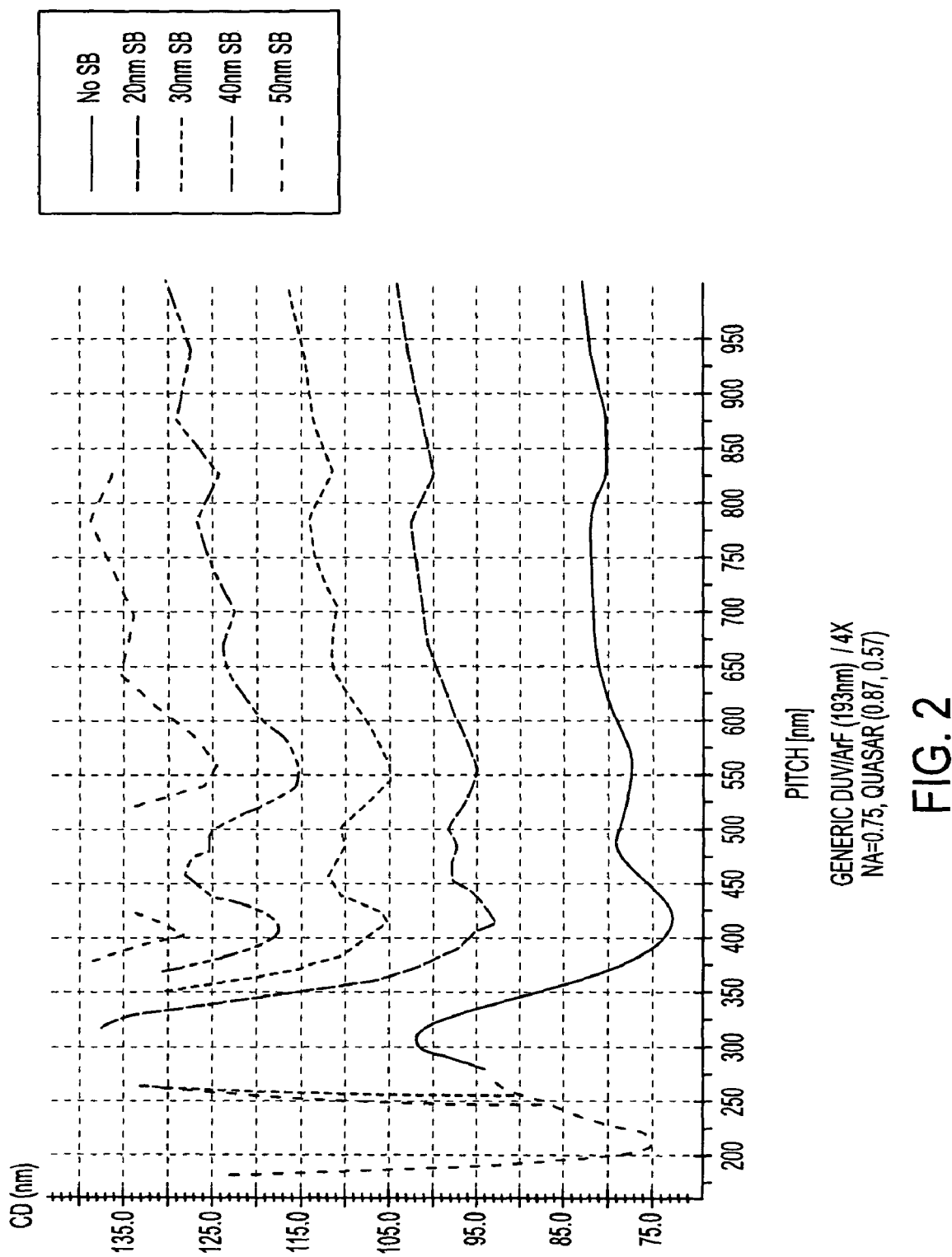
Figure 3:
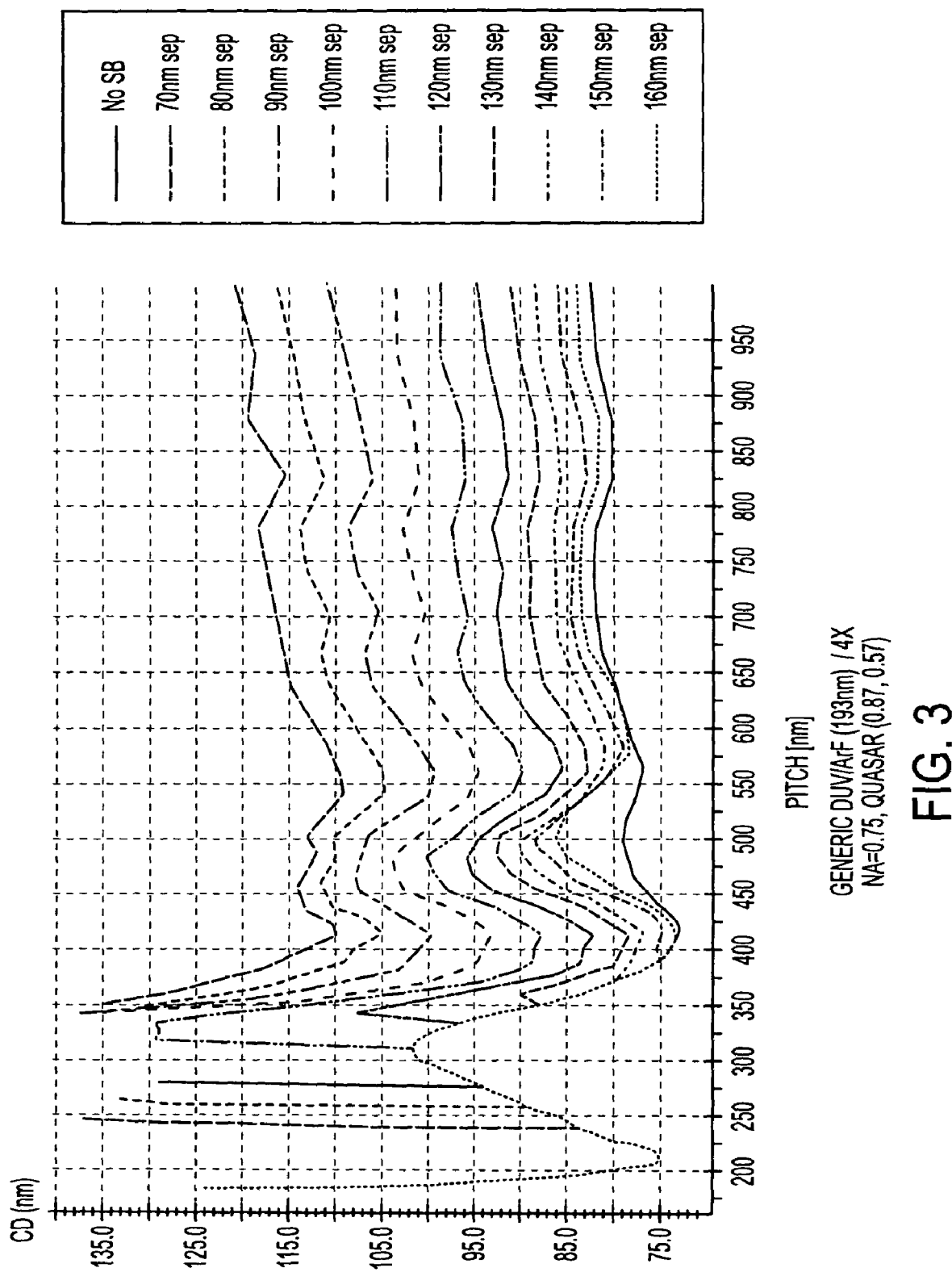
Figure 5:
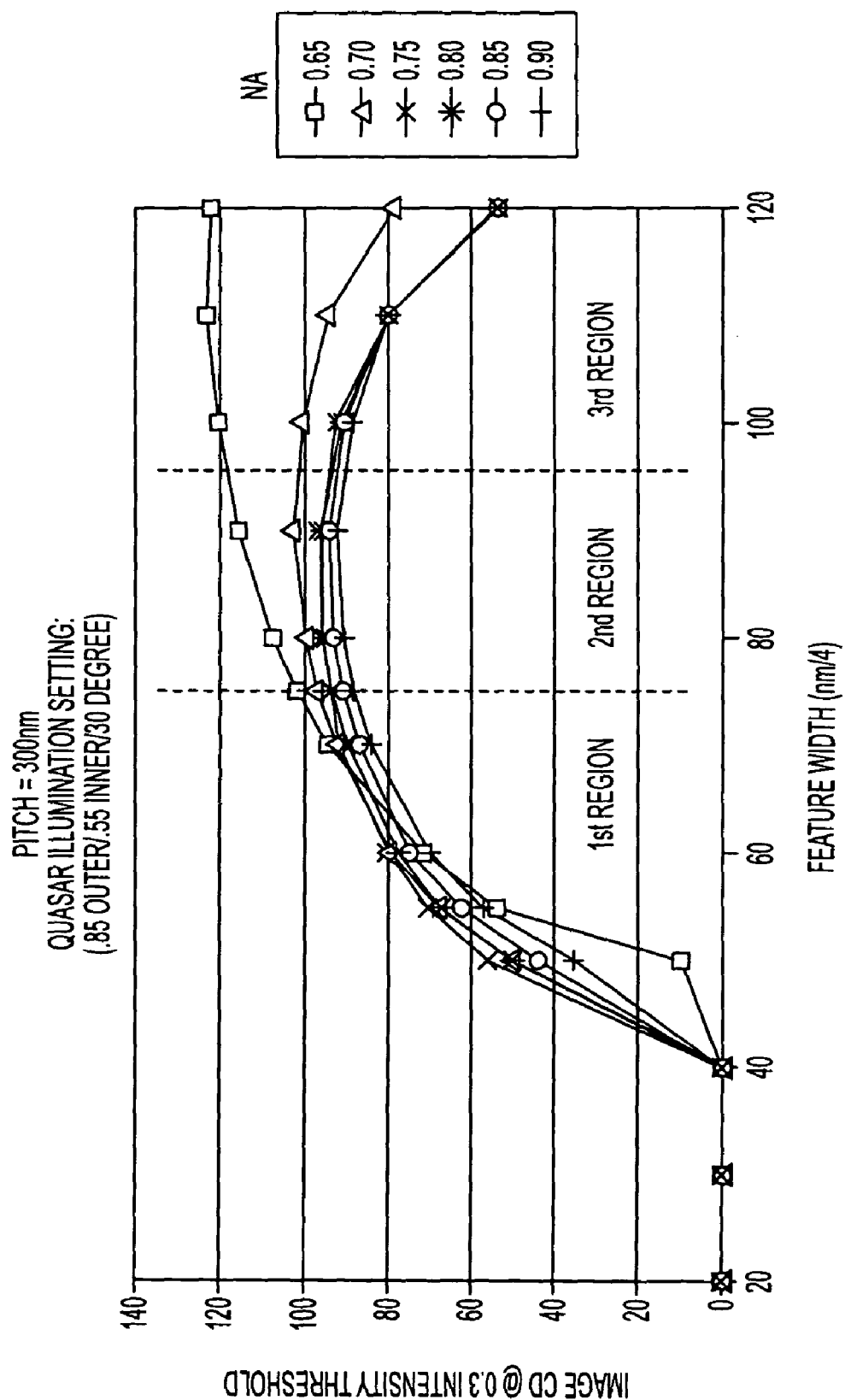
FIG. 5 illustrates the separation of the aerial image behavior of CPL features into three distinct zones.

As illustrated in FIG. 5, it is shown that essentially three distinct "regions" of aerial image slope can be observed: a $1^{st}$ region with a positive aerial image slope; a $2^{nd}$ region with a near zero aerial image slope; and a $3^{rd}$ region with a negative aerial image slope. The first region is characteristic of a CPL feature having a small width, where the two phase edges are close to each other. As shown in FIG. 5, in the first region, as the CD of the feature increases, the CD of the resulting feature imaged on the wafer also increases in a substantially linear manner. In the first region, two phase edges interact closely to form a single line pattern.

The second region designates the maximum feature size that can be achieved using two adjacent chromeless phase edges. As shown in FIG. 5, in the second region, the slope of the aerial image is near zero. As such, as the feature width continues to increase, the width of the resulting feature imaged on the wafer no longer increases in a linear manner (i.e., the width of the imaged feature essentially remains the same, regardless of the variation of the feature width). This is due to the fact that in the second region, the two phase edges begin to lose the interactivity necessary for proper image formation.

In the third region the two phase edges are too far apart from each other to have sufficient interaction during image formation. As a result, as shown in FIG. 5, the width of the imaged feature clearly no longer corresponds to the width of the desired feature. It is noted that while the aerial image behavior of FIG. 5 corresponds to CPL features having a fixed pitch, as a practical matter variations in pitch will also effect the resulting CDs. Accordingly, the present invention also considers the consequences of variations in pitch on resulting CDs when determining the three "Zones" as detailed below.

As noted above, the mask error enhancement factor (MEEF) is a ratio between the change of printed resist feature CD and the change of corresponding mask feature CD. A MEEF=1 refers to a resist CD change which has a 1:1 ratio to the mask CD change (i.e., a linear response). A MEEF<1 refers to a resist CD change that is less than the same amount of change in the mask CD. A MEEF>1 refers to a resist CD change that is more than the same amount of change in the mask CD. A MEEF=0 refers to a resist feature CD that does not correspond to the CD change on the mask feature. In general, for the best CD control on the wafer, it is desirable to have a MEEF of 1 or less. However when MEEF nears zero, it implies that it is not possible to achieve a desired wafer CD target since it is not possible change the mask feature CD to print the corresponding CD on the wafer. When MEEF is negative, this means that the wafer CD will be printed smaller than the mask CD.

As is shown from the foregoing, while CDs within the first region can be reproduced accurately on the wafer utilizing CPL techniques, CDs within the second and third regions are not. More specifically, for feature widths (i.e., CDs) in the second region, the printed feature width tends to stay fixed regardless of the CD of the feature on the mask. This is mainly due to near zero slope of the aerial image. The target CD in the second region is generally smaller than what can be imaged with a chrome feature. Moreover, zero aerial image slope makes it nearly impossible to modulate the CD using mask data bias, hence, optical proximity correction (OPC) is not possible. In the third region, positive mask bias causes negative image bias, hence, OPC is difficult. The third region is also characterized by a very poor process window. For mask feature sizes greater than a certain size in the third region, no image is formed at all.

In view of the foregoing problems associated with maintaining CD linearity over a wide range of feature widths and pitch, the present invention provides a method and technique for maintaining CD linearity over each of the first, second and third regions so as to allow a wide range of CDs to be accurately reproduced on the substrate utilizing the same processing conditions.

The first step in the process entails defining the CDs to be included in each of the first, second and third regions or zones. In accordance with the present invention, Zone 1 is defined to include feature widths (CDs) that can be imaged using chromeless phase edges (i.e., no chrome); Zone 2 is defined to include features widths that are too large to be imaged using chromeless techniques (i.e., adjacent phase edges) and too small to be imaged using a chrome pattern (there is inadequate aerial image contrast for these features of Zone 2); and Zone 3 is defined to include feature widths that are large enough to be imaged using a chrome pattern. It is noted that the zone definitions here are not necessarily the same as the regions observed from the CPL image behavior plot shown in FIGS. 4c and 5. It is further noted that the definition of the zones is highly dependent on imaging parameters, such as exposure wavelength, numerical aperture (NA) and illumination settings, etc. As explained below, the determination of the various zones can be performed by either simulation, experimental or rule based techniques.

Figure 6:
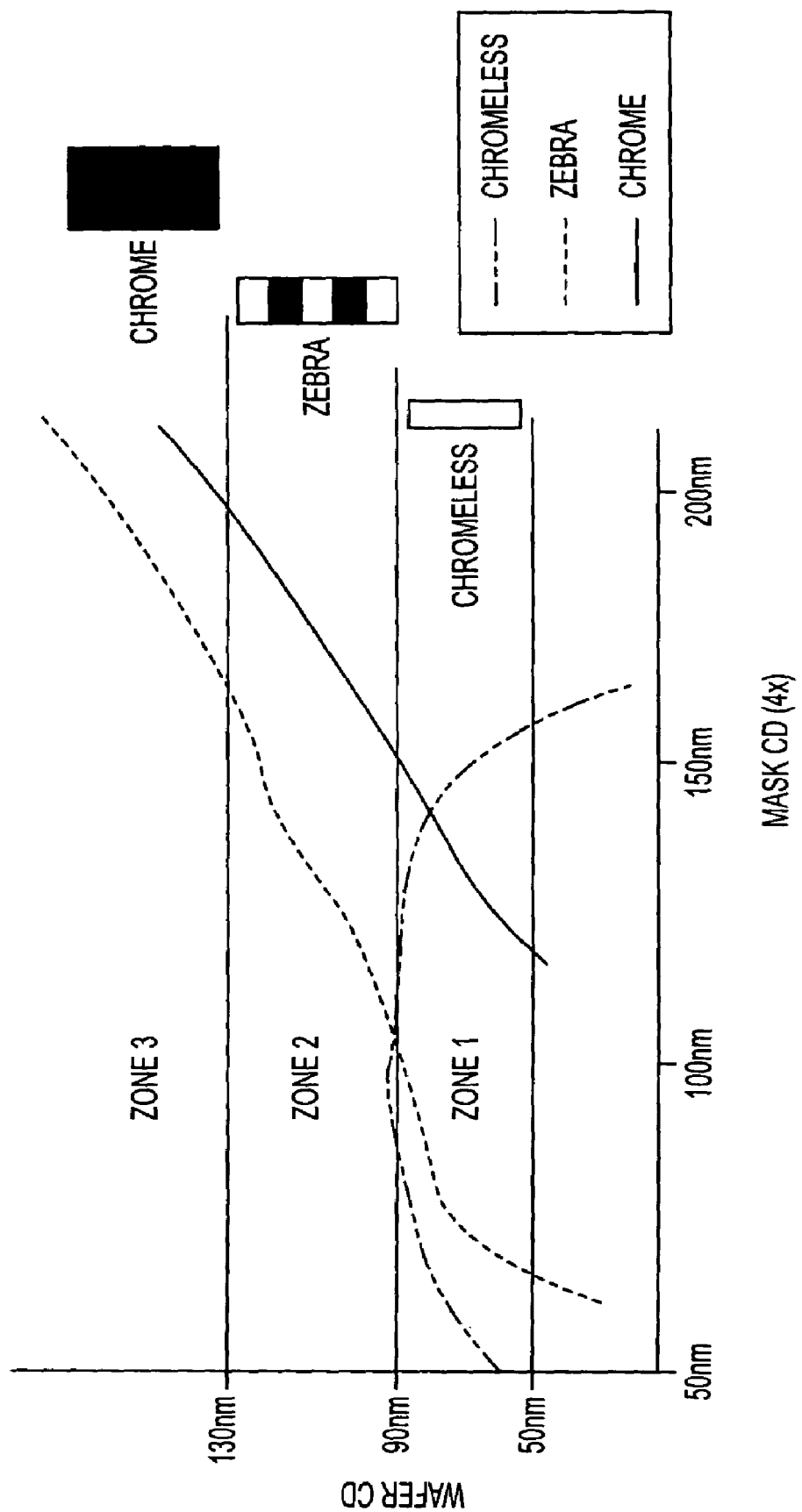
FIG. 6 illustrates an example of the definition of Zones 1, 2 and 3 in accordance with the present invention.

Once the three "zones" are defined on the basis of CD size, a mask pattern type for patterning features contained in each "zone" is assigned to each of the three zones. In accordance with the current embodiment, for Zone 1 (i.e., the smallest mask CDs) a chromeless PSM (or CPL mask) is utilized to print each featured contained in this zone. For Zone 2 (i.e., medium CDs) at least one of the following four identified mask pattern methods is utilized: Zebra, Skunk, Rim, or halftone edge biasing. For Zone 3 (i.e., large CDs), chrome or non-phase-shifted mask patterns are utilized. FIG. 6 illustrates an example of the separation of Zones 1, 2 and 3 based on CD dimensions in accordance with the present invention.

It is noted that controlling the linearity of the CDs in Zone 2 is the most critical. The masking techniques utilized for features contained in Zone 2 function to modulate local transmission, and to introduce $0^{th}$ diffraction order to the two-beam imaging system (with Chromeless PSM). The $0^{th}$ diffraction order is necessary to "increase" the MEEF from near zero to become more positive.

With regard to features having CDs falling within Zone 2, as stated, in accordance with the present invention, these features are imaged utilizing one of the four following mask patterns, namely, Zebra, Skunk, Rim and Halftone Edge Bias. It is noted that U.S. Pat. No. 6,114,071 discusses a halftone edge bias mask type, and is herein incorporated by reference.

Figure 7C:
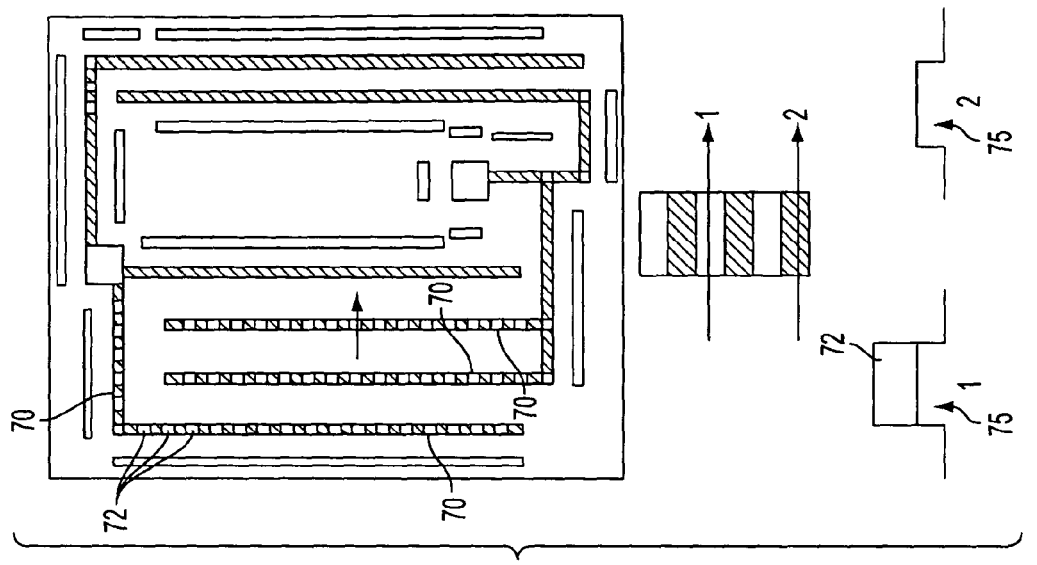
FIGS. 7a–7c illustrate exemplary embodiments of Skunk, Rim and Zebra mask layouts and corresponding mask substrate topologies in accordance with the present invention.
Figure 7B:
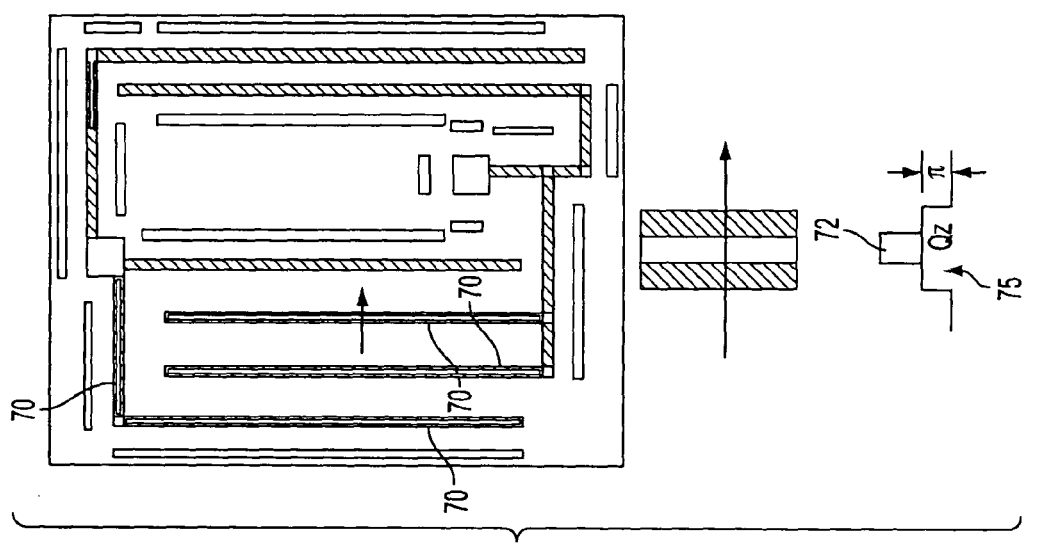
Figure 7A:
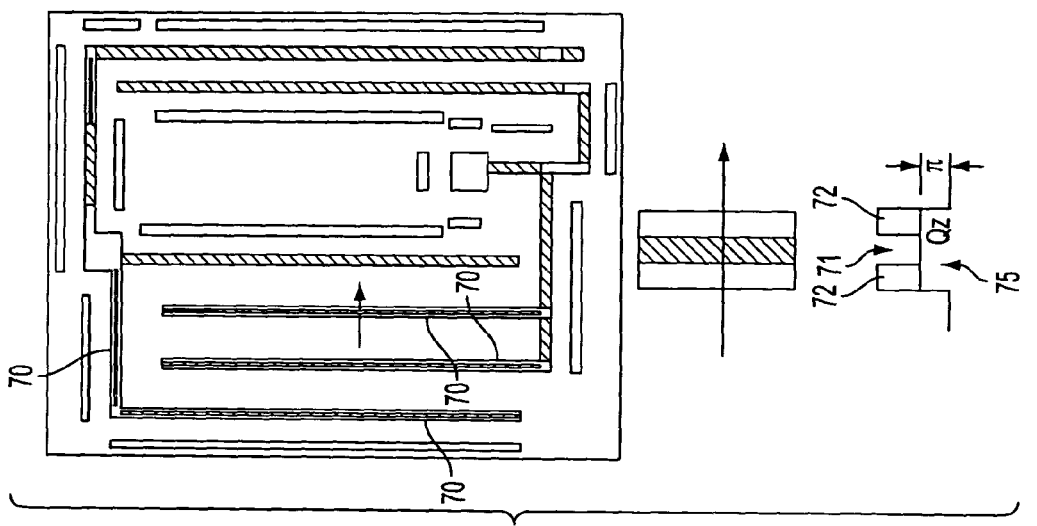

FIGS. 7a–7c depict an exemplary mask layout of Skunk, Rim and Zebra masks, respectively, and their associated substrate topology. As shown in each of FIGS. 7a–7c, the features 70 contained in Zone 2 are printed utilizing Skunk, Rim and Zebra mask patterns, respectively. Referring to FIG. 7a, the Skunk mask pattern employs a strategy in which an opening 71 is located between two parallel chrome portions 72 which may be formed on a non-phase-shifted portion 75 of a quartz substrate. In other words, a chromeless feature pattern (e.g., the double phase edge), which can be utilized in Zone 1, is modified to further include two chrome portions 72 disposed thereon. As shown, the chrome portions 72 are disposed on the edges of the feature and are separated by opening 71. As explained below, these additional chrome portions 72 effectively control the percentage of transmission and thereby improve the resulting imaging performance. Referring to FIG. 7b, the Rim mask pattern is essentially the same as the Skunk mask pattern, however, only a single additional chrome portion 72 is disposed in the center of the feature. In both the Skunk and Rim mask patterns, the additional chrome portions 72 extend along the same axis as the feature 70 being imaged. Turning to the Zebra pattern, as shown in FIG. 7c, the Zebra layout employs a plurality of chrome portions 72 (i.e., chrome patches), which are formed on the chromeless feature pattern to be imaged. As explained in further detail below, while the performance results of each of the foregoing mask patterns is essentially the same, the Zebra pattern provides significant advantages with regard to mask manufacturability. It is further noted that the chrome portions 72 utilized in the Zebra pattern are illustrated as rectangular or square for exemplary purposes only. Clearly, other shapes for the chrome portions 72 are possible.

In each of the foregoing mask patterns (e.g., Skunk, Rim and Zebra), each of the chrome portions 72 disposed on top of the chromeless feature to be printed have dimensions such that the chrome portions are sub-resolution, so as to prevent the chrome portions 72 from being imaged on the wafer as individual features.

Figure 8:
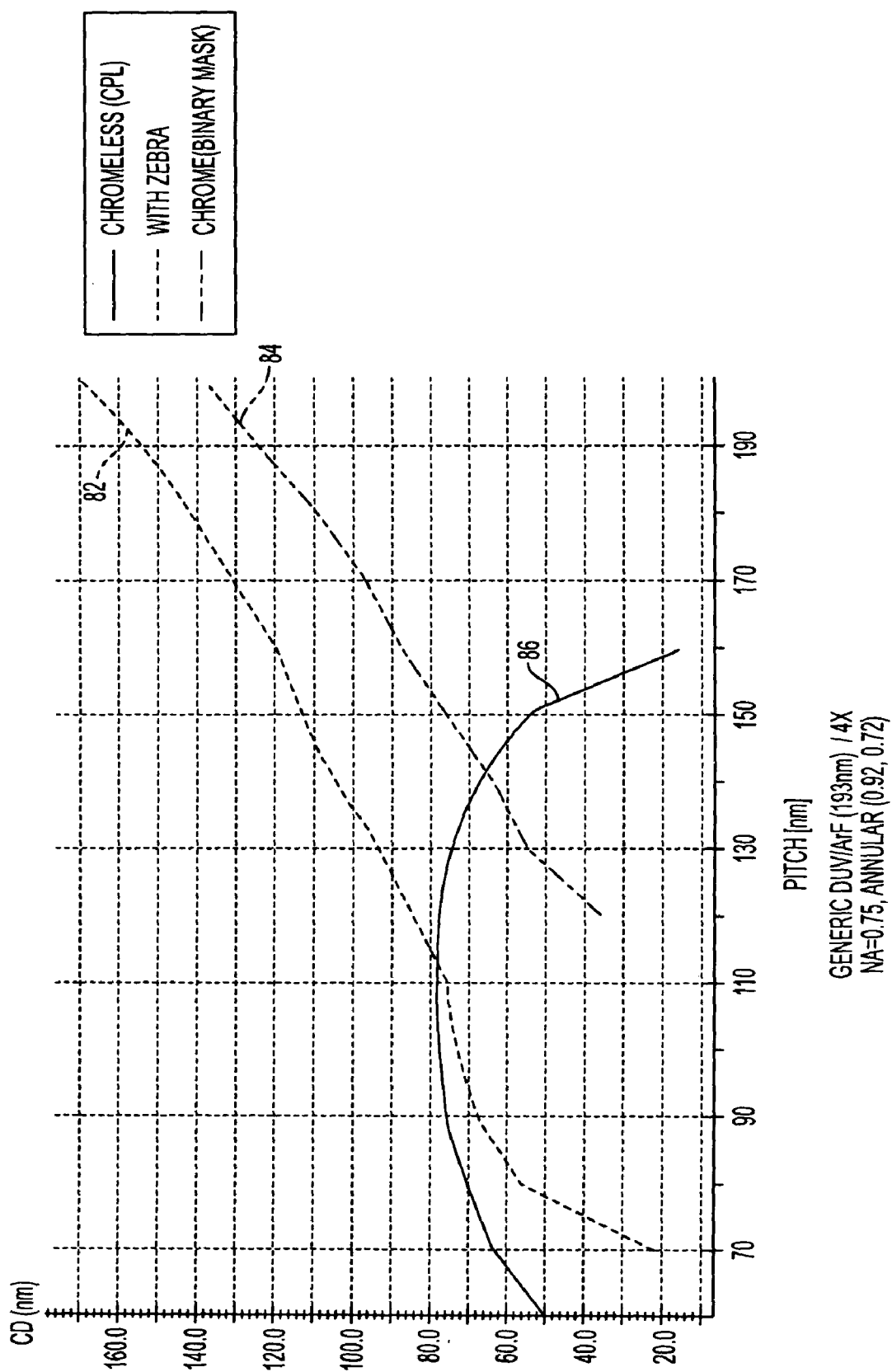
FIG. 8 illustrates an exemplary plot of Zebra CD linearity performance.

FIG. 8 illustrates a plot 82 of the Zebra layout CD linearity performance, wafer CD vs. pitch, under the following conditions: a generic DUV/ArF (193 nm)/4x and NA=0.75, annular(0.92, 0.72). As is shown, in plot 82, the present invention provides for significant improvement in CD linearity performance through pitch relative to a mask utilizing solely chromeless phase techniques as is illustrated in plot 86. FIG. 8 further depicts a plot 84 of a chrome (binary mask). Thus, by utilizing the modified mask pattern (e.g., Zebra) for printing CDs falling within Zone 2, there is a significant improvement in the resulting linearity of CDs.

Figure 9A:
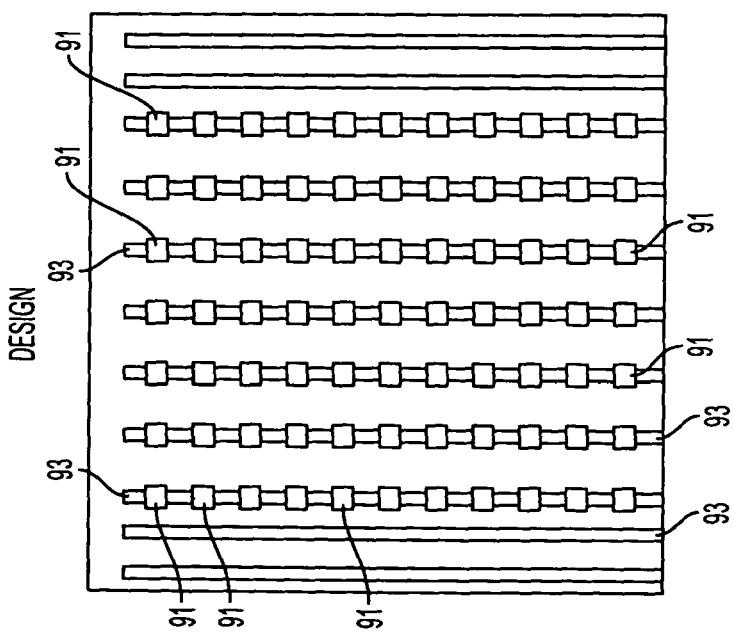
FIGS. 9a–9c illustrate an exemplary embodiment of a Zebra mask layout pattern and corresponding image performance.
Figure 9B:
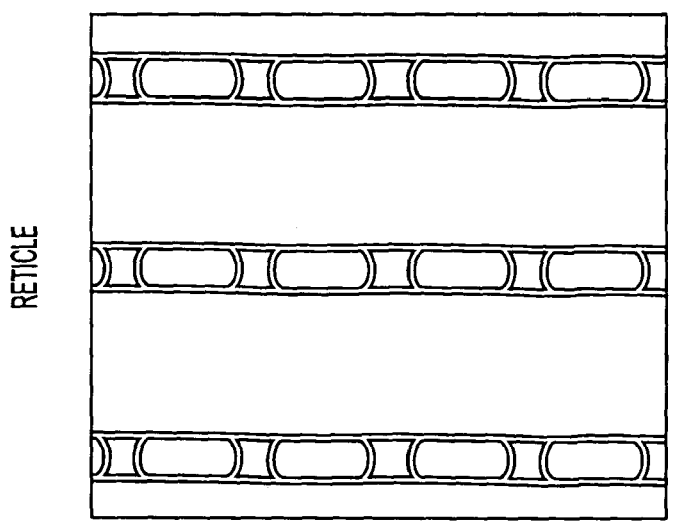
Figure 9C:
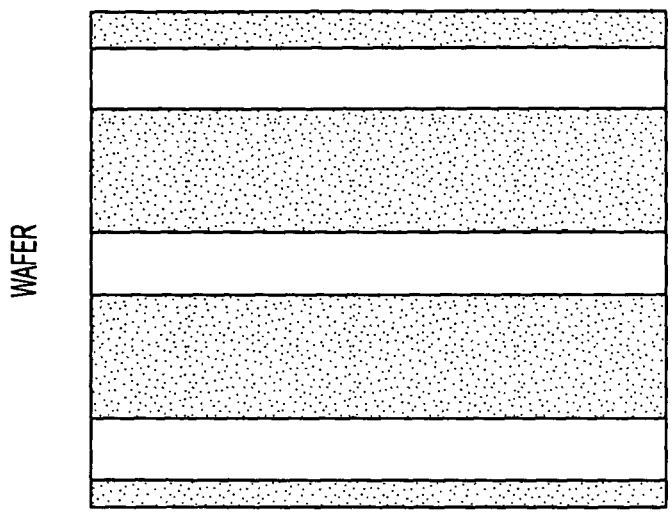

FIG. 9a illustrates an exemplary Zebra pattern for printing features having CDs falling within Zone 2, FIG. 9b illustrates a simulated image performance of the reticle, and FIG. 9c illustrates the simulated image performance of the resulting wafer. As shown, in FIG. 9a, the square chrome patches 91 are disposed over chromeless line patterns 93. The resulting image produced on the wafer indicates that the Zebra styled mask pattern produces a well-behaved aerial image with clear imaging contour without any zigzagging or other discontinuity effects. It is noted that the simulation in the given example was performed using an ASML/800 KrF, 0.80 NA, QUASAR, with a 90 nm target CD and a 260 nm pitch.

Figure 10:
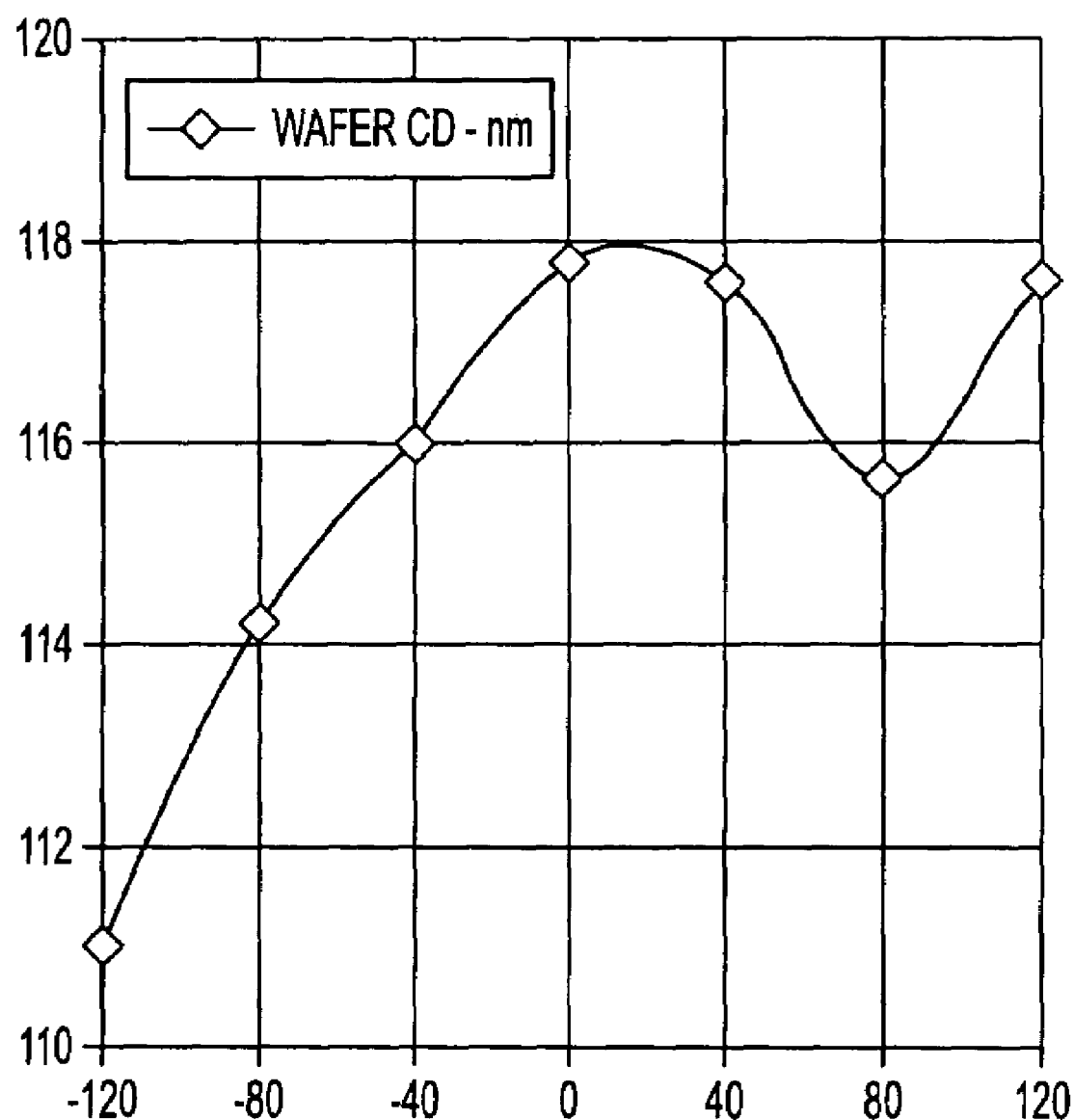
FIG. 10 illustrates the minimal effect of Zebra biasing errors on wafer CD.

FIG. 10 illustrates the effect of sizing errors in the chrome patches utilized in the Zebra mask layout on the wafer CD. Specifically, the plot illustrates the measured resist wafer CD (along the Y axis) vs. the chrome patch sizes (from −120 nm in the left to +120 nm in the right) (along the X axis). As illustrated by FIG. 10, the resulting resist CD does not change much when the chrome patch varies between −40 nm to +120 nm. This illustrates that the particular placement of the chrome patch on the chromeless feature to be imaged is not critical. In the given example, a 160 nm variation in bias results in a 2 nm CD error in the resist wafer. Thus, the Zebra mask layout significantly facilities the mask manufacturing and imaging process. It is noted that the plot of FIG. 10 was obtained using an ASML PAS 5500/800 with 0.80 NA, 0.87/0.57, 30 degree QUASAR.

All of the three techniques (i.e., Zebra, Skunk and Rim) for patterning features falling within Zone 2 utilize two mask writing steps. The first mask writing step is the critical mask writing step, and entails forming the chromeless phase shift pattern corresponding to the feature to be imaged (i.e., the first mask writing step defines the phase edges). The second mask writing step entails defining the desired chrome patch to form the Zebra, Skunk, or Rim pattern, respectively. When performing the second mask writing step, both the Skunk and Rim techniques require precision overlay with respect to the first writing step. This is due to the fact that a shift in the placement of the chrome could result in a shift of the centroid of the aerial image, thereby causing line placement error. Thus, a misalignment problem in the second mask writing step can significantly reduce the effectiveness of the Skunk and Rim techniques (e.g., if the chrome portion is not properly positioned on the chromeless feature). However, in contrast, the Zebra technique provides significant tolerance for overlay errors (i.e., misalignment). This is due to the fact that the chrome patches in Zebra are "self-aligned". Thus, the Zebra technique generates minimal alignment issues.

In one embodiment of Zebra, the chrome patches are initially formed so as to extend orthogonal relative to the chromeless feature to be printed, and preferably to be "oversized". While the foregoing simplifies the manufacturing process, it is also allows for significant control of the transmission percentage and modulation of transmission so as to optimize the imaging performance. Indeed, transmission control can be readily effected by changing the pitch between chrome patches on a given feature to be printed. This is possible due to the fact that the chrome features extend orthogonal relative to the chromeless feature to be printed. Thus, by increasing the width of the chrome patches as the chrome is deposited on the substrate, it is possible to reduce the pitch between chrome patches on a given CPL feature. Alternatively, by reducing the width of the chrome being deposited (i.e., in a direction extending orthogonal to the longitudinal axis of the feature), the pitch between the chrome patches on a given feature increases. As such, the Zebra treatment pattern can be easily adjusted to control the percentage transmission, without causing any alignment issues.

Additionally, issues concerning the data volume of the mask layout should be considered. Comparing the four types of mask methods, both Skunk and Rim have low data volume while both Zebra and halftone edge biasing have high mask data count due the nature of the pattern formation. However, the data volume for both Zebra and halftone edge biasing should typically be acceptable since only a small fraction of the full-chip pattern is required to apply the Zone 2 solution.

Figure 11B:
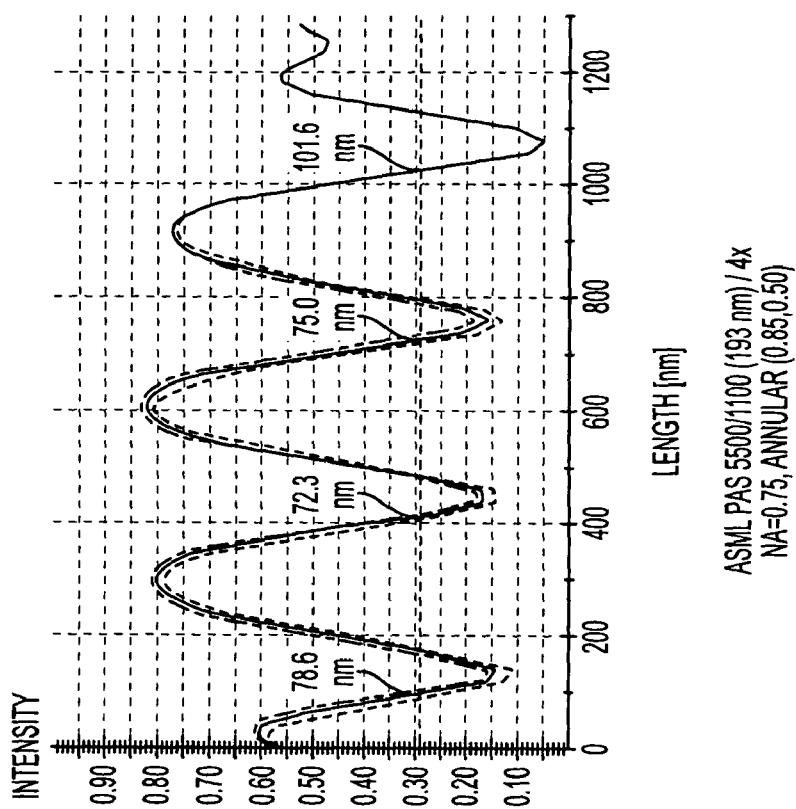
FIG. 11 illustrates an exemplary performance comparison of Skunk, Rim and Zebra mask layouts.
Figure 11A:
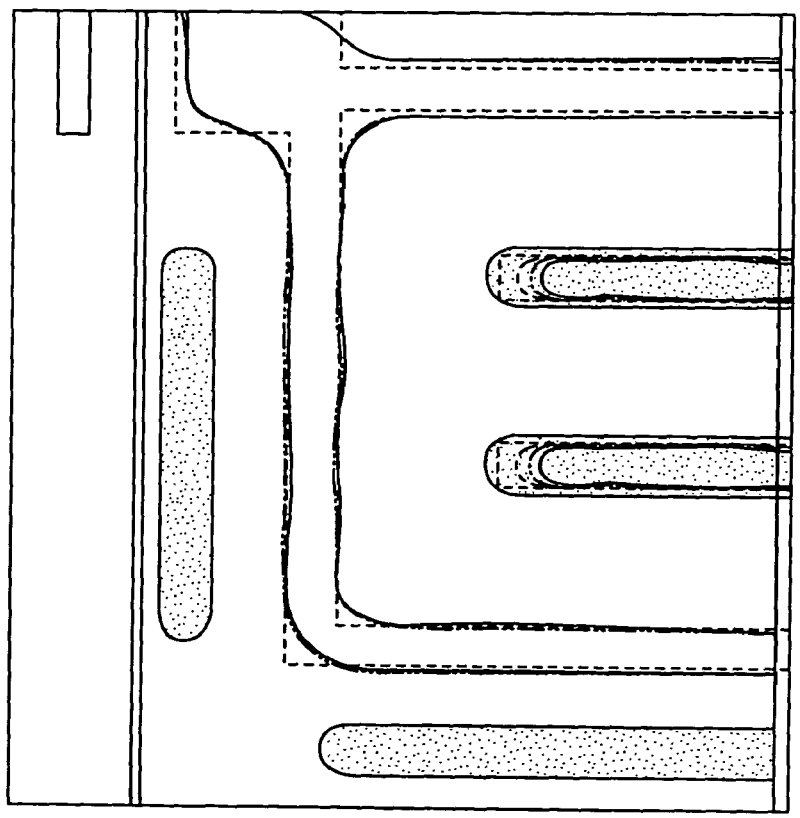

FIGS. 11a and 11b illustrate a performance comparison for Skunk, Rim and Zebra layouts in the form of a pictorial performance comparison and a plot of the Dose Profile for each layout. As shown in FIGS. 11a and b, there is not much of an image difference for the Skunk, Rim and Zebra layouts.

Figure 12:
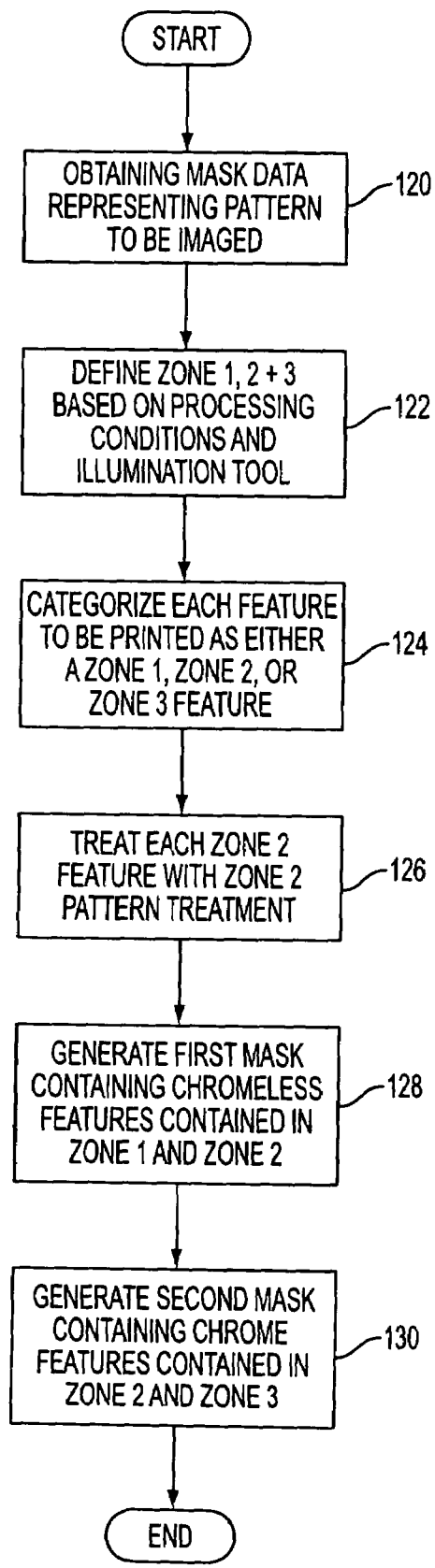
FIG. 12 sets forth an exemplary flowchart illustrating the general method of the present invention.

FIG. 12 sets forth an exemplary flowchart illustrating the general method of the present invention. The first step (Step 120) is to obtain the desired mask pattern to be imaged on the wafer. Such mask data can be in GDS format or any other suitable data format. The next step (Step 122) is to determine the cutoff points for Zones 1, 2 and 3. In the current embodiment, the Zones are defined on the basis of the CDs of the features to be printed. As noted above, the Zones 1, 2 and 3 can vary depending on the given set of processing conditions and tools being utilized to image the wafer. One method of defining the Zones is to run a simulation utilizing the desired conditions so as to determine the aerial image behavior and MEEF of the given process relative to feature width. Thereafter, the "Zones" can be readily identified, for example, based on slope of the resulting aerial image of CPL features as described above in conjunction with FIG. 5. Once the "Zones" are identified, each of the features (i.e., geometry's) are assigned to a given zone (i.e., Zone, 1, 2 or 3) based on the CD thereof (Step 124). Next, (Step 126) each feature identified as a Zone 2 geometry's is treated with one of the foregoing Zone 2 pattern treatments. In the preferred embodiment, a Zebra pattern treatment is applied. The next step entails generating a first mask pattern containing each of the chromeless phase components of the features contained in Zone 1 and Zone 2 (Step 128), and generating a second mask pattern containing each of the chrome components of the features contained in Zone 2 and 3 (Step 130). Then, the first mask pattern and the second mask pattern are imaged in separate imaging steps, in order to form the desired image on the wafer.

It is noted that the foregoing flowchart is only an overview of the method of the present invention. It should be clear to the reader that additional steps may be included with the foregoing method. For example, it is possible to also apply other OPC techniques (e.g., scattering bars OPC) to the mask design. In the case of scattering bars, these would be included in the second mask pattern containing chrome features. Of course, additional OPC techniques can also be incorporated in the foregoing method of the present invention. In addition, various illuminations, for example, off-axis illumination, can be utilized to further improve the imaging process.

It is further noted that the foregoing method could be implemented utilizing a model based method for identifying and classifying Zone 2, and the features contained within Zone 2. Such a method would track the process set forth in FIG. 12.

For example, in accordance with the present invention, model classification of Zone 2 may be based on sizing. This may be achieved by, after separation of Zone 3 features, using a model to predict mask feature CDs based on feature size to identify Zone 1 or Zone 2 features. Features greater than a predetermined number X, are Zone 2 features while features less than or equal to X are Zone 1 features. The "X" refers to a certain mask dimension. The value X may be determined by the numerical aperture (NA) and the exposure wavelength (WL) used for the exposure. This relationship can be described as, for example, $X \sim (WL/NA)$. The smaller WL and larger NA will cause X to become smaller. However, a precise number for X should be empirically determined.

Further, model classification of Zone 2 may be based on biasing direction. This may be achieved by, after separation of Zone 3 features, using a model to predict mask feature bias based on a feature bias to identify Zone 1 or Zone 2 features. Features biased positive are Zone 2 features, and features biased zero and negative are Zone 1 features.

In addition, model classification of Zone 2 may be based on MEEF. This may be achieved by, after separation of Zone 3 features, using a model to predict mask feature CD based on simulated MEEF to identify Zone 1 or Zone 2 features. Features with MEEF greater than 1.5 or less than 0.8 are Zone 2 features, and features with MEEF between 1.5 and 0.8 are Zone 1 features.

It is also possible to utilize a rule-based method to identify and classify Zone 2. To summarize, the rule-based method would comprise the steps of: (1) defining each region (i.e., Zones 1, 2 and 3) based on line and space sizing, which can be determined based on a simulation or experimental result; (2) extracting features contained in Zone 1 based on feature width (such features will be formed without chrome), (3) extracting features contained in Zone 2 based on feature width and modifying such features to include Zone 2 pattern treatment (preferably Zebra); (4) extracting features contained in Zone 3 and patterning such features utilizing chrome; and (5) separating phase patterns (Zone 1 and 2 features) and chrome patterns (Zone 2 and 3 features) into two separate mask patterns. As with the general method disclosed above, the rule-based method can be modified to include various other OPC techniques.

Figure 13:
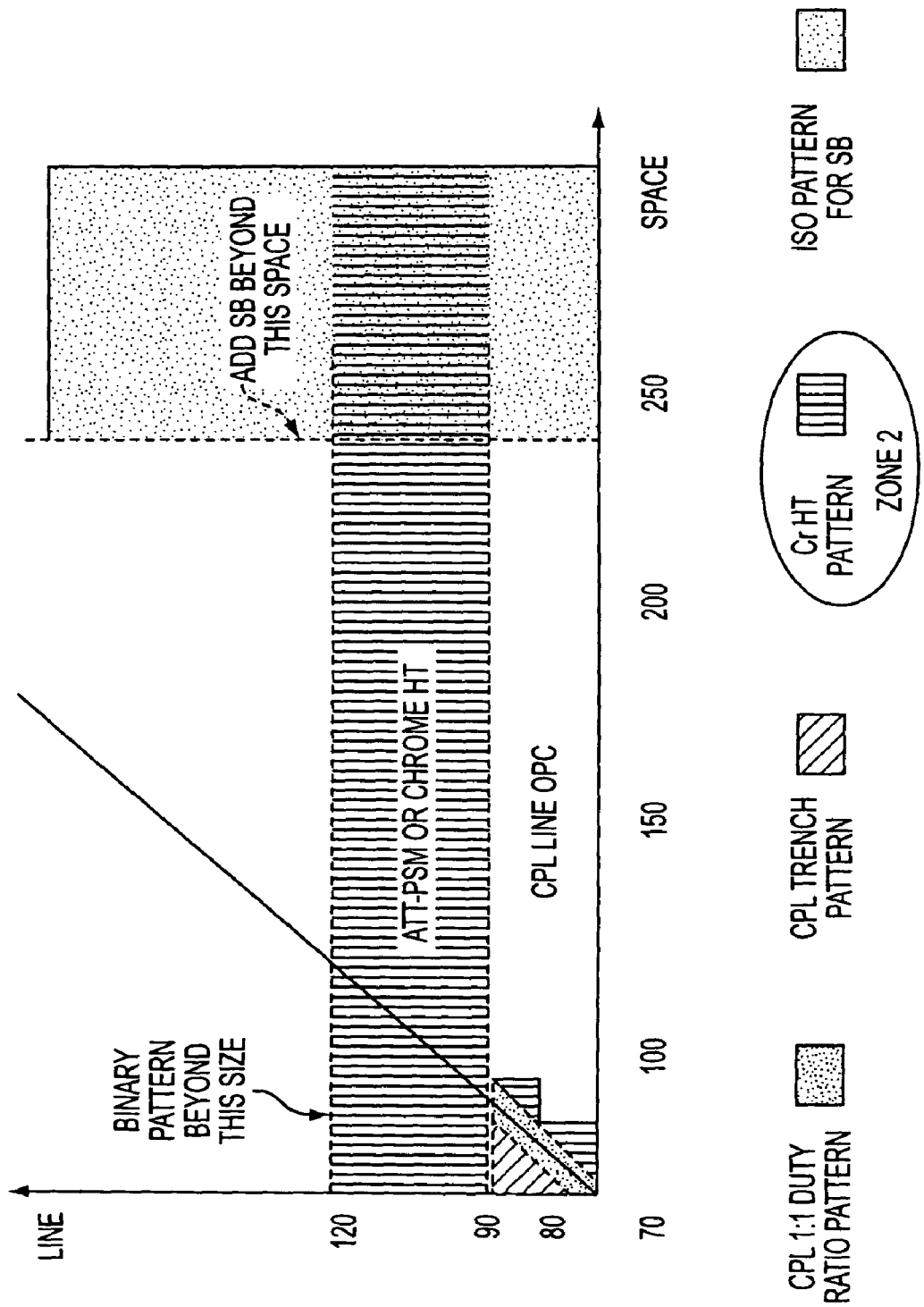
FIG. 13 illustrates an exemplary CPL layout design rule utilized to classify Zone 2 according to the present invention.

FIG. 13 graphically depicts a CPL layout design rule to classify Zone 2. As depicted in FIG. 13, a binary pattern is utilized beyond a predetermined width, and SBs are added beyond a predetermined spacing between features. Moreover, with a predetermined band of line widths the design rule calls for Att-PSM or chrome halftoning (HT), and below this band, the rule calls for CPL line OPC. The depicted design rule also calls for a CPL 1:1 duty ratio pattern in a horizontal zone up to the Att-PSM or chrome HT band, a CPL trench pattern in a triangular zone below the Att-PSM or chrome HT band, a Cr HT pattern in a stepped triangular zone below the CPL trench pattern zone, and an Iso pattern for SB in a vertical rectangular zone beyond a predetermined space.

Figure 14:
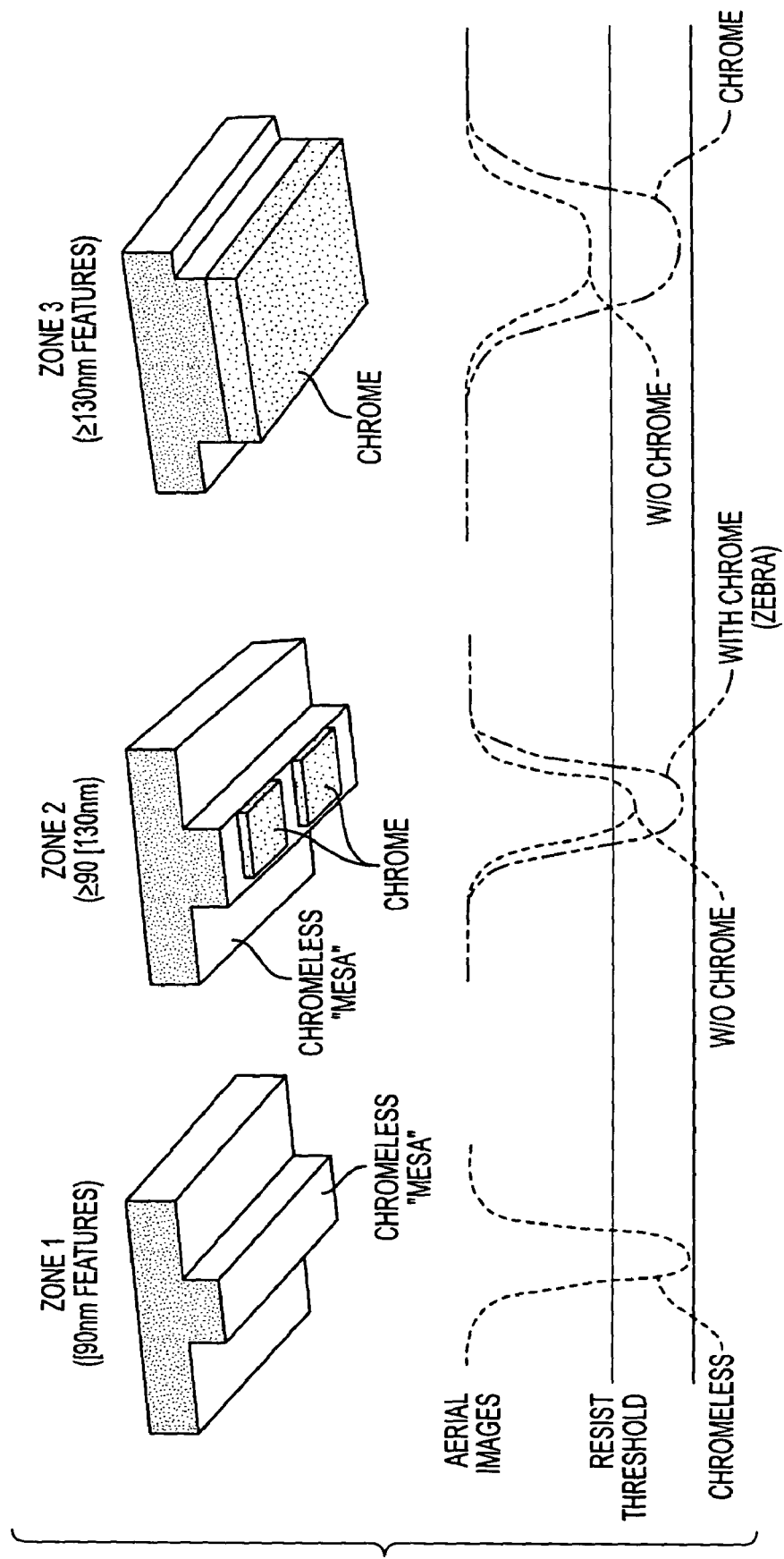
FIG. 14 illustrates an example of the improvement in imaging performance obtained by utilizing the present invention.

FIG. 14 illustrates an example of the improvement in imaging performance obtained by utilizing the present invention. Referring to FIG. 14, feature having widths of 90 nm or less were deemed to reside in Zone 1. As shown, features in Zone 1 are printed utilizing adjacent phase edges (i.e., chromeless features). Features having widths between 90 nm and 130 nm were deemed to reside in Zone 2. Zone 2 features were modified to include Zebra pattern treatment. As shown, the use of the chrome patches improved the imaging performance. Features having a width greater than 130 nm were deemed to reside in Zone 3, and were printed utilizing chrome. As shown, without the use of chrome, Zone 3 features would not be imaged on the wafer. Accordingly, FIG. 14 illustrates how the use of chrome as applied in Zone 2 and Zone 3 in accordance with the present invention, provides for control in maintaining CD linearity as the width of the features contained in the design vary.

It is noted that as discussed above, the foregoing process of the present invention for generating the first and second masks is typically performed utilizing CAD systems in conjunction with mask generating software, such as MaskWeaver™ sold by ASML MaskTools. Such CAD systems and mask design software can be readily program to include the process of the present invention.

Figure 15:
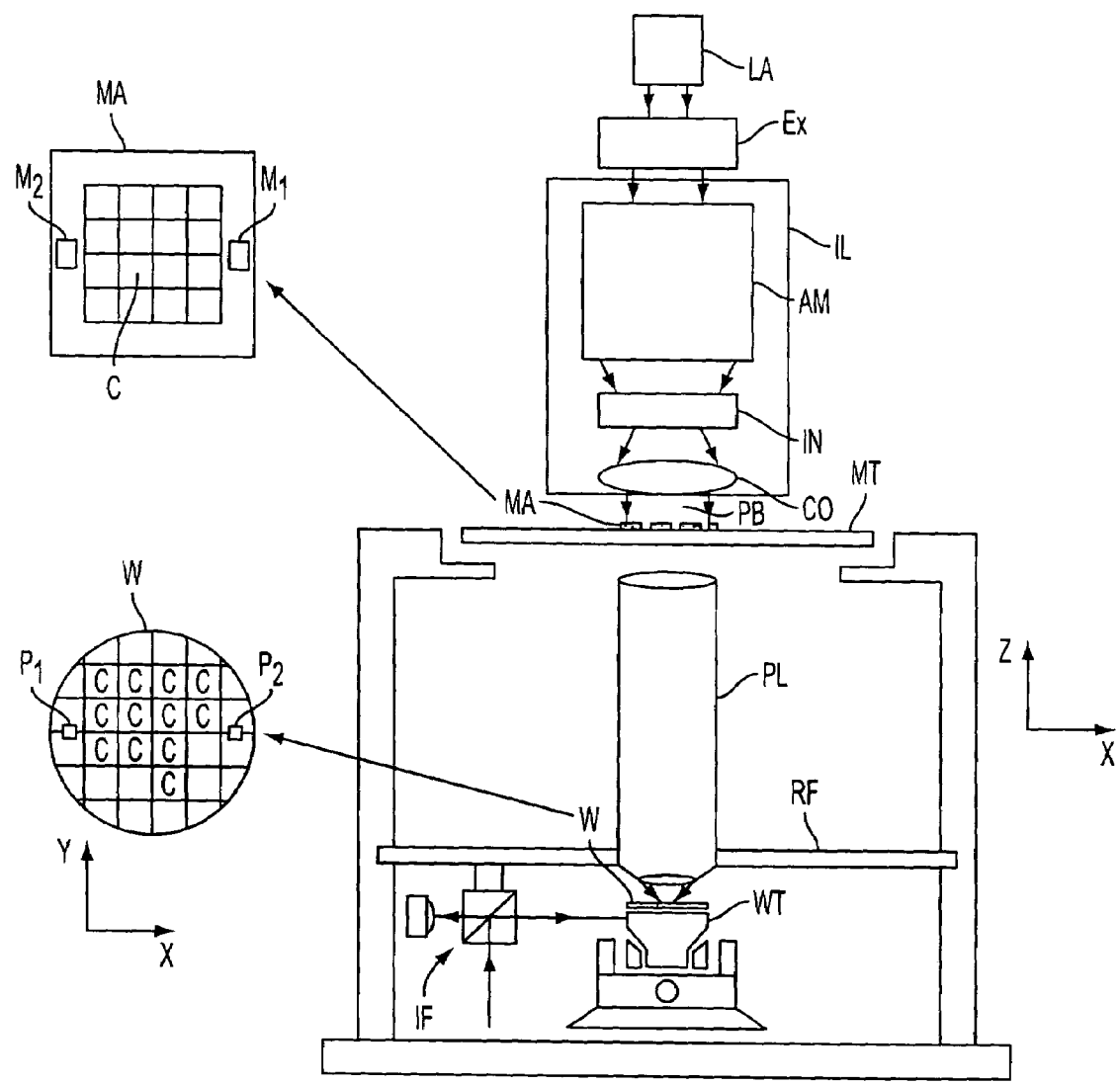
FIG. 15 schematically depicts a lithographic projection apparatus suitable for use with the masks designed with the aid of the current invention.

FIG. 15 schematically depicts a lithographic projection apparatus suitable for use with the masks designed with the aid of the current invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. a refractive, catoptric or catadioptric optical system) for imaging an irradiated portion of the mask MA onto a target portion C (e.g. comprising one or more dies) of the substrate W.

As depicted herein, the apparatus is of a transmissive type (i.e. has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g. a mercury lamp, excimer laser or plasma discharge source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 15 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g. with the aid of suitable directing mirrors); this latter scenario is often the case when the source LA is an excimer laser (e.g. based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 15. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As described above, the method of the present invention provides important advantages over the prior art. For example, the present invention provides a simple and systematic approach for defining and maintaining "linear" behavior with regard to the printing of CDs, as the CDs and pitch of the features contained in the given mask pattern vary.

Although certain specific embodiments of the present invention have been disclosed, it is noted that the present invention may be embodied in other forms without departing from the spirit or essential characteristics thereof. The present embodiments are therefore to be considered in all respects as illustrative and not restrictive, the scope of the invention being indicated by the appended claims, and all changes that come within the meaning and range of equivalency of the claims are therefore intended to be embraced therein.

We claim:

1. A method of generating a mask for printing a pattern comprising a plurality of features having varying critical dimensions, said method comprising the steps of:
   obtaining data representing said pattern;
   defining a plurality of distinct zones based on the critical dimensions of said plurality of features;
   assigning each of said features into one of said plurality of distinct zones; and
   forming a given feature in said mask pattern utilizing a technique selected in accordance with the predefined distinct zone said given feature is assigned,
   wherein said plurality of distinct zones comprises:
   a first zone in which features having a critical dimension less than or equal to a first predetermined amount are imaged utilizing chromeless phase lithography techniques;
   a second zone in which features having a critical dimension greater than said first predetermined amount and less than a second predetermined amount are imaged utilizing a combination of chromeless phase lithography techniques and chrome; and
   a third zone in which features having a critical dimensions greater than said second predetermined amount are imaged utilizing chrome.

2. The method of generating a mask according to claim 1, wherein at least one of said features in said first zone is implemented in said mask as adjacent phase edges etched in a substrate.

3. The method of generating a mask according to claim 1, wherein at least one of said features in said second zone is implemented in said mask as adjacent phase edges etched in a substrate, with chrome patches disposed on an upper surface of said substrate remaining between said adjacent phase edges.

4. The method of generating a mask according to claim 3, wherein said chrome patches operate to control the percentage transmission of a light source incident on said mask.

5. The method of generating a mask according to claim 1, further comprising the steps of:
   identifying the features contained in said first zone, and the chromeless phase components of the features contained in said second zone,
   generating a first mask for imaging the chromeless phase components contained in said first zone and said second zone,
   identifying the chrome components of the features contained in said second zone, and the chrome components of the features contained in said third zone,
   generating a second mask for imaging the chrome components contained in said second zone and said third zone.

6. A mask for use in a photolithography process manufactured in accordance with claim 1.

7. The method of generating a mask according to claim 1, wherein, in the step of defining a plurality of distinct zones, a simulation process is utilized to determine the aerial image behavior of a selected imaging process relative to the critical dimensions of the plurality of features.

8. The method of generating a mask according to claim 3, wherein said chrome patches disposed on an upper surface of said substrate remaining between said adjacent phase edges are formed by initially depositing chrome features which extend orthogonal to the longitudinal axis of said at least one said feature in said second zone.

9. A computer program product for controlling a computer comprising a recording medium readable by the computer, means recorded on the recording medium for directing the computer to generate files corresponding to a mask for printing a pattern comprising a plurality of features having varying critical dimensions, said generation of said files comprising the steps of:
   obtaining data representing said pattern;
   defining a plurality of distinct zones based on the critical dimensions of said plurality of features;
   assigning each of said features into one of said plurality of distinct zones; and
   forming a given feature in said mask pattern utilizing a techniqiue selected in accordance with the predefined distinct zone said given feature is assigned,
   wherein said plurality of distinct zones comprises:
   a first zone in which features having a critical dimension less than or equal to a first predetermined amount are imaged utilizing chromeless phase lithography techniciues;
   a second zone in which features having a critical dimension greater than said first predetermined amount and less than a second predetermined amount are imaged utilizing a combination of chromeless phase lithography techniques and chrome; and
   a third zone in which features having a critical dimensions greater than said second predetermined amount are imaged utilizing chrome.

10. The computer program product according to claim 9, wherein at least one of said features in said first zone is implemented in said mask as adjacent phase edges etched in a substrate.

11. The computer program product according to claim 9, wherein at least one of said features in said second zone is implemented in said mask as adjacent phase edges etched in a substrate, with chrome patches disposed on an upper surface of said substrate remaining between said adjacent phase edges.

12. The computer program product according to claim 11, wherein said chrome patches operate to control the percentage transmission of a light source incident on said mask.

13. The computer program product according to claim 9, said generation of files further comprising the steps of:
   identifying the features contained in said first zone, and the chromeless phase components of the features contained in said second zone,
   generating a first mask for imaging the chromeless phase components contained in said first zone and said second zone,
   identifying the chrome components of the features contained in said second zone, and the chrome components of the features contained in said third zone,
   generating a second mask for imaging the chrome components contained in said second zone and said third zone.

14. The computer program product according to claim 9, wherein, in the step of defining a plurality of distinct zones, a simulation process is utilized to determine the aerial image behavior of a selected imaging process relative to the critical dimensions of the plurality of features.

15. The computer program product according to claim 11, wherein said chrome patches disposed on an upper surface of said substrate remaining between said adjacent phase edges are formed by initially depositing chrome features which extend orthogonal to the longitudinal axis of said at least one said feature in said second zone.

16. A device manufacturing method comprising the steps of:
   (a) providing a wafer that is at least partially covered by a layer of radiation-sensitive material;
   (b) providing a projection beam of radiation using a radiation system;
   (c) using a pattern on a mask to endow the projection beam with a pattern in its cross-section;
   (d) projecting the patterned beam of radiation onto a target portion of the layer of radiation-sensitive material,
   wherein said mask is formed by:
      obtaining data representing said pattern;
      defining a plurality of distinct zones based on critical dimensions of a plurality of features;
      assigning each of said features into one of said plurality of distinct zones; and
      forming a given feature in said mask pattern utilizing a technique selected in accordance with the predefined distinct zone said given feature is assigned,
   wherein said plurality of distinct zones comprises:
      a first zone in which features having a critical dimension less than or equal to a first predetermined amount are imaged utilizing chromeless phase lithography techniques;
      a second zone in which features having a critical dimension greater than said first predetermined amount and less than a second predetermined amount are imaged utilizing a combination of chromeless phase lithography techniques and chrome; and
      a third zone in which features having a critical dimensions greater than said second predetermined amount are imaged utilizing chrome.

17. A device manufactured using a method according to claim 16.

18. A method of printing a pattern comprising a plurality of features having varying critical dimensions, said method comprising the steps of:
   obtaining data representing said pattern;
   defining a plurality of distinct zones;
   assigning each of said features into one of said plurality of distinct zones; and
   forming a given feature in a mask utilizing a technique selected in accordance with the distinct zone said given feature is assigned,
   wherein said plurality of distinct zones comprises:
      a first zone in which features having a critical dimension less than or equal to a first predetermined amount are imaged utilizing chromeless phase lithography techniques;
      a second zone in which features having a critical dimension greater than said first predetermined amount and less than a second predetermined amount are imaged utilizing a combination of chromeless phase lithography techniques and chrome; and
      a third zone in which features having a critical dimensions greater than said second predetermined amount are imaged utilizing chrome.

19. The method according to claim 18, further comprising the steps of:
   identifying the features contained in said first zone, and the chromeless phase components of the features contained in said second zone,
   generating a first mask for imaging the chromeless phase components contained in said first zone and said second zone,
   identifying the chrome components of the features contained in said second zone, and the chrome components of the features contained in said third zone,
   generating a second mask for imaging the chrome components contained in said second zone and said third zone.

20. The method according to claim 18, wherein, in the step of defining a plurality of distinct zones, a simulation process is utilized to determine the aerial image behavior of a selected imaging process relative to the critical dimensions of the plurality of features.

21. A device manufactured using a method according to claim 18.

* * * * *